United States Patent [19]
Parsons et al.

[11] Patent Number: 5,492,752
[45] Date of Patent: Feb. 20, 1996

[54] SUBSTRATES FOR THE GROWTH OF 3C-SILICON CARBIDE

[75] Inventors: James D. Parsons, Beaverton; Ajay K. Chaddha; Her S. Chen, both of Portland; Jin Wu, Beaverton, all of Oreg.

[73] Assignee: Oregon Graduate Institute of Science and Technology, Beaverton, Oreg.

[21] Appl. No.: 83,903

[22] Filed: Jun. 25, 1993

Related U.S. Application Data

[63] Continuation-in-part of Ser. No. 986,999, Dec. 7, 1992, abandoned.

[51] Int. Cl.⁶ .................................................. B32B 15/04
[52] U.S. Cl. .................... 428/212; 428/446; 428/697; 428/698; 428/699; 428/704
[58] Field of Search ......................... 428/446, 699, 428/698, 697, 212, 704

[56] References Cited

U.S. PATENT DOCUMENTS

| | | | |
|---|---|---|---|
| 4,639,028 | 1/1987 | Olson | 294/34 |
| 4,738,937 | 4/1988 | Parsons | 437/180 |
| 4,767,666 | 8/1988 | Bunshah et al. | 428/334 |
| 4,912,063 | 3/1990 | Davis et al. | 437/100 |
| 4,923,716 | 5/1990 | Brown et al. | 423/249 |
| 4,946,547 | 8/1990 | Palmour et al. | 156/643 |
| 5,043,773 | 8/1991 | Precht et al. | 357/16 |
| 5,184,199 | 2/1993 | Fujii et al. | 257/77 |

FOREIGN PATENT DOCUMENTS

| | | |
|---|---|---|
| 3613012 | 11/1986 | Germany . |
| 2010772 | 1/1990 | Japan . |
| 2199098 | 8/1990 | Japan . |

*Primary Examiner*—Archene Turner
*Attorney, Agent, or Firm*—Klarquist Sparkman Campbell Leigh & Whinston

[57] ABSTRACT

A substrate for the growth of monocrystalline β-SiC is formed by providing a body of monocrystalline hexagonal material having a planar surface with a lattice parameter that is within ±5% of the lattice parameter of 6Hα-SiC in the basal plane and growing a body of monocrystalline cubic material on the surface to provide a planar cubic material surface that is without grain boundaries, subgrain boundaries, double positioning boundaries, and pits. The cubic material, for example TiC, ZrC, HfC, or TiN, has a rock salt structure and a lattice parameter within ±5% of the lattice parameter of β-SiC. Monocrystalline β-SiC can be nucleated and grown on the surface of the cubic material.

17 Claims, 1 Drawing Sheet

SUBSTRATES FOR THE GROWTH OF 3C-SILICON CARBIDE

This is a continuation-in-part of application Ser. No. 07/986,999, filed Dec. 7, 1992 now abandoned.

BACKGROUND OF THE INVENTION

This invention relates to methods for the synthesis of monocrystalline films and crystals that are suitable as substrates to support the growth of cubic monocrystalline 3C-silicon carbide ($\beta$-SiC).

It has long been believed that monocrystalline $\beta$-SiC would be a superior semiconductor material to silicon (Si). Monocrystalline $\beta$-SiC has no polytypic form and its electronic transport properties are superior to Si and all other SiC forms. The superior properties can potentially extend the range of solid state electronic applications beyond present power, power-frequency, temperature and radiation density limits. $\beta$-SiC seems particularly suited for operation at high temperature such as, for example, 400°–600° C.

SiC was early identified as a candidate material for integrated circuitry applications since it has a high breakdown voltage, relatively large band gap, and a thermal conductivity of more than three times that of silicon at ambient temperature. SiC is also resistant to the diffusion of impurity species. It has been hoped that SiC devices can be substituted for Si devices.

Despite its apparent advantages, SiC has not been used for semiconductor devices because it has not been possible to produce unpolytyped SiC single crystals of sufficient size to allow the fabrication of semiconductor devices. To be useful, a $\beta$-SiC single crystal must be substantially free of defects. But, to date, there are no reliable techniques to produce defect-free $\beta$-SiC single crystals of a sufficient size to be used in integrated circuit production.

Nucleation of the $\beta$ form of SiC occurs below 1700° C. and useful bulk SiC crystal growth rates occur at much higher temperatures. Since SiC is only thermodynamically stable in an $\alpha$-SiC phase at temperatures exceeding 1600° C. there has been no practical way to directly grow monocrystalline $\beta$-SiC from a melt or by sublimation. Small bulk single crystals of $\beta$-SiC have been fabricated, but with dimensions no greater than a few millimeters.

The only practical way to synthesize high-purity $\beta$-SiC single crystals appears to be by thin film growth from a vapor at temperatures below 1600° C., such as by chemical vapor deposition (CVD), or gas source molecular beam epitaxy. Several methods have been used to transport Si and C atoms to a substrate for the purpose of depositing $\beta$-SiC as a thin film. Further, several methods have been employed to initiate nucleation and growth, and to sustain growth of $\beta$-SiC. Examples of such methods appear in U.S. Pat. Nos. 4,767,666 and 4,923,716.

Epitaxy has not yet worked as hoped due to the lack of a suitable monocrystalline substrate to support the heteroepitaxial growth of monocrystalline $\beta$-SiC. To be successful, a substrate would need to have certain properties with respect to $\beta$-SiC. First, the thermal coefficient of expansion of the substrate should be greater than (to compressively load the epilayer) or equal (to minimize strain) to that of $\beta$-SiC. Second, any lattice parameter mismatch between the substrate and the $\beta$-SiC should be less or about equal to 1%. Third, the substrate must be thermally and chemically stable under conditions required for $\beta$-SiC growth. Also, for cost efficiency it would be desirable if the substrate could be fabricated in bulk, single crystal form.

The most important part of a substrate for single-crystal epitaxial growth of thin film is its surface, upon which the thin film is nucleated and grown. In general, substrates are cut from bulk crystals and the surface of the substrate is polished to a flat smooth surface. The reason that the entire substrate must be a single crystal with low defect concentration is that its surface properties will reflect its bulk properties. Thus, if a substrate contains a high defect density or it is polycrystalline, then its surface will have a high defect density or it will be polycrystalline.

Unfortunately, each of the previously used substrates has lacked one of the above-mentioned properties.

The substrates which have been used for the purpose of attempting to nucleate monocrystalline, epitaxial layers of $\beta$-SiC are: $Al_2O_3$, AlN, 6H$\alpha$-SiC, Si, and TiC. There have also been a few reports of $\beta$-SiC epitaxy on very small $\beta$-SiC substrates.

The development of 6H$\alpha$-SiC bulk crystal growth capabilities spurred interest in its use as a substrate for $\beta$-SiC epitaxial growth. However, it has been found that 6H$\alpha$-SiC substrate surfaces do not have suitable properties for nucleating low-defect concentration, monocrystalline $\beta$-SiC thin films. In particular, experimental evidence shows that $\beta$-SiC can only be nucleated on the perfectly oriented (0001) and (0114) 6H$\alpha$-SiC surfaces, where <111> $\beta$-SiC is nucleated on (0001) 6H$\alpha$-SiC surfaces, and <001> $\beta$-SiC is nucleated on (0114) 6H$\alpha$-SiC surfaces. The slightest misorientation results in homoepitaxial growth of 6H$\alpha$-SiC.

Experimental evidence also shows that $\beta$-SiC epilayers grown on the (0001) 6H$\alpha$-SiC surfaces contain double positioning boundaries (DPB) defects which make them useless for semiconductor device and IC development. DPB defects can be explained as follows. There are six atoms on the surface of the hexagonal basal plane to which depositing atoms can bond. If the depositing atoms nucleate as a cubic structure, then there can be only three bonds attached to the six surface plane atoms. Thus, to form a cubic structure, the nucleating atoms must attach to every other atom in the basal plane of the hexagonal lattice. This causes the random nucleation of two $\beta$-SiC epilayer orientations. Both orientations are identical perpendicular to the 6H$\alpha$-SiC substrate, but they are misoriented 60° with respect to each other in the plane of the substrate surface. The DPBs between these two orientations are incoherent and they have a high internal energy. The internal energy of the DPBs is released by the formation of stacking faults. These stacking faults seriously degrade the electronic transport properties of the $\beta$-SiC epilayer.

In attempts to grow $\beta$-SiC on Si substrates, the resulting $\beta$-SiC crystal has been found to contain high concentrations of crystallographic defects resulting from significant mismatches between the lattice parameters and the expansion coefficients of the two materials.

Of the substrates tested, only TiC and $\beta$-SiC have ever yielded monocrystalline, epitaxial $\beta$-SiC substantially free of microcracks, antiphase domains, and double positioning boundaries. The problem with these substrates is that they are difficult to synthesize as large single crystals. The development of $\beta$-SiC single-crystal growth technology, where the $\beta$-SiC crystals are of significant size, may not be possible at all because of the relationship between silicon carbide crystalline form and the temperature at which it is synthesized.

TiC is particularly suitable as a substrate for nucleation and growth of monocrystalline, epitaxial $\beta$-SiC. The lattice parameter mismatch to β-SiC is less than 1% and TiC forms an almost ideal Schottky interface with β-SiC, which is beneficial for ohmic contacts to n-type β-SiC in vertical devices. Because both materials are cubic, the problem of double positioning boundaries can be completely eliminated. TiC and β-SiC have similar thermal expansion, and titanium is electrically inert in β-SiC. However, TiC has not been a successful substrate due to the difficulty of producing TiC single crystals possessing the requisite quality. Prior TiC substrates have suffered from pinholes and subgrain boundary defects. It has been found that the pinholes and the subgrain boundaries in the TiC substrate generate the same defects into the structure of β-SiC film grown on the TiC.

For this reason, there is still a need for a substrate on which one can successfully grow monocrystalline β-SiC that is substantially defect free and of a useful size.

SUMMARY OF THE INVENTION

According to the present invention, β-SiC is grown on a surface of a substrate consisting of a cubic crystalline material that has a rock salt structure. The cubic material has a lattice parameter within ±5% of the lattice parameter of β-SiC. For example, crystals of TiC, ZrC, HfC, or TiN are grown by starting with a single crystal of a hexagonal material having a lattice parameter within ±5% of the lattice parameter of 6Hα-SiC in the basal plane. The hexagonal material, preferably 6Hα-SiC, provides a surface upon which to nucleate and grow a crystal of the cubic material, e.g. TiC, ZrC, HfC, or TiN. The resulting body of cubic material is completely free of subgrain boundaries and double positioning boundaries, with crystallinity independent of the exposed polytype. The monocrystalline cubic material in turn, provides a surface having crystalline properties suitable for nucleation and epitaxial growth of an IC quality, β-SiC, monocrystalline thin film.

Theory does not predict the growth of DPB free, monocrystalline cubic crystals (such as TiC, ZrC, HfC, and TiN epilayers) on hexagonal crystal structures such as 6Hα-SiC. One would expect the formation of double positioning boundaries. The surface of 6Hα-SiC nucleates monocrystalline, DPB-free TiC, ZrC, HfC, and TiN for reasons unknown.

The 6Hα-SiC can be used as a substrate upon which to nucleate and grow TiC, ZrC, HfC, or TiN monocrystalline thin films, which are suitable for nucleation and growth of semiconductor device and IC quality β-SiC. Or, the 6Hα-SiC can be used as a substrate on which to nucleate and grow TiC, ZrC, HfC, or TiN bulk single crystals, which can be cut into TiC, ZrC, HfC, or TiN substrate wafers for nucleation and growth of semiconductor device and IC quality β-SiC.

Thin-film TiC, ZrC, HfC, or TiN (at least 50 ångströms (Å) thick) on 6Hα-SiC has an advantage over bulk substrates cut from ingots. Because 6Hα-SiC provides an excellent heat sink, the thermal expansion coefficient mismatch between the 6Hα-SiC/cubic material substrate and β-SiC is almost zero, so there is little strain in the β-SiC. The thermal expansion mismatch between a TiC ingot substrate and β-SiC is greater than 20%.

Since the cubic materials, e.g. TiC, ZrC, HfC, and TiN, of the present invention are free of subgrain boundaries and other DPBs, there is no problem of such defects being duplicated in the β-SiC crystals grown upon them.

DETAILED DESCRIPTION

Figure 1:
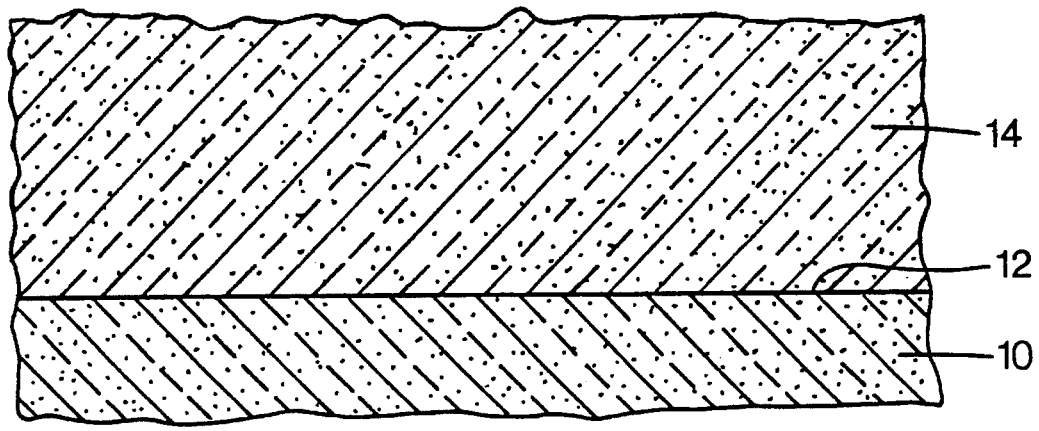
FIG. 1 is a partial elevational view of a substrate according to the present invention having a layer of 6Hα-SiC and a layer of TiC, ZrC, HfC, or TiN.
Figure 2:
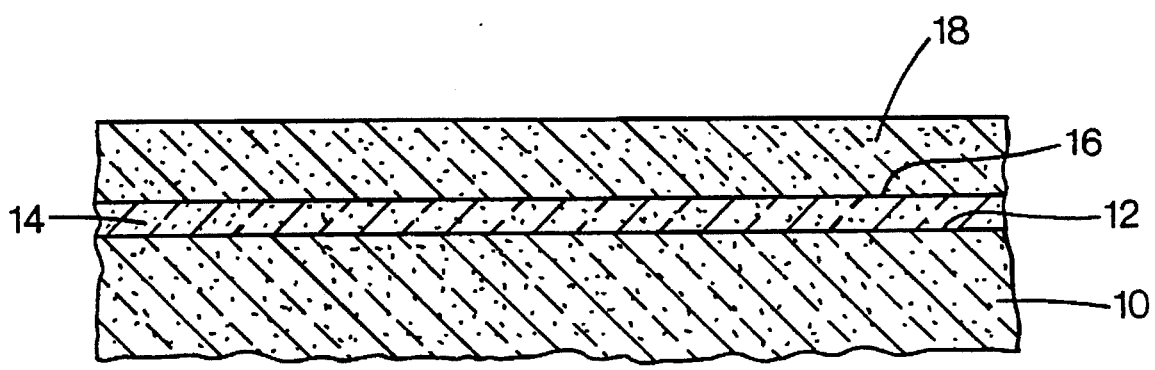
FIG. 2 is a partial elevational view of the substrate shown in FIG. 1, a layer of β-SiC being present on the upper surface of the substrate.

In accord with the present invention, single crystals 10 of a hexagonal material having a planar surface with a lattice parameter that is within ±5% of the lattice parameter of 6Hα-SiC in the basal plane are used as the starting material for a substrate for the growth of monocrystalline β-SiC.

Most conveniently, crystals of hexagonal form SiC (6Hα-SiC) are grown or can be obtained from commercial sources, such as Cree Research and Westinghouse. These crystals consist substantially of 6Hα-SiC, with some hexagonal polytypes (e.g., 2Hα and 4Hα-SiC). Such crystals may come with a mirror-like surface 12 at the (0001) Si face or may require diamond polishing to prepare such a surface.

A thin film 14 of a single crystal of TiC, or other cubic material (such as ZrC, HfC, or TiN) having a rock salt structure and having a lattice parameter within ±5% of the lattice parameter of β-SiC, is nucleated and grown directly on the surface 12 of the hexagonal crystal 10 of SiC by any vapor phase growth technique, preferably chemical vapor deposition. The film should be grown to a thickness of at least 50 Å.

Chemical vapor deposition can be conducted at a pressure from ultra high vacuum to many atmospheres. The temperature must be sufficiently high, at least 1,000° C., and the growth rate sufficiently low for the cubic material to grow epitaxially. The growth rate can be increased if the temperature is elevated. Titanium, zirconium, hafnium, and carbon atoms can be obtained from any of a number of common sources including elemental titanium, elemental zirconium, elemental hafnium, elemental carbon, organometallic compounds, and hydrides.

For example, TiC can be nucleated and grown by chemical vapor deposition from $TiCl_4$ (0.85 sccm) and $C_2H_4$ (1.0 sccm) with $H_2$ (2900 slpm) as a diluent. Successful results are achieved at 1,220° C. and atmospheric pressure.

The resulting TiC film is completely free of subgrain boundaries and DPBs. The crystallinity of such TiC is independent of the exposed polytype of the 6Hα-SiC.

The TiC can be used for nucleation and growth of device and IC quality β-SiC. An exposed surface 16 of the TiC is prepared by annealing in hydrogen at 1300° C. A layer 18 of β-SiC can then be deposited on the prepared TiC surface by following the method described in U.S. Pat. No. 4,767,666 or 4,923,716.

For example, a 6Hα-SiC/TiC couple substrate in the form shown in FIG. 1 can be placed in a vacuum chamber which is initially evacuated to a vacuum of about $10^{-6}$ torr. Conventional vacuum procedures can be utilized, including baking of the vacuum chamber prior to and during pumping.

Prior to loading in to the vacuum chamber, the substrate should be degreased using a solvent such as acetone with an alcohol rinse and air dry. Immediately prior to being loaded into the vacuum chamber, the substrate should be lightly etched in dilute hydrofluoric acid. The substrate may then be placed into a holder within the vacuum chamber where it is separated from an evaporation source by a shutter which is maintained closed until a steady state decomposition condition is reached.

To evaporate silicon, an electron beam from an electron beam gun can be directed against a grounded silicon ingot which serves as a feedstock. The electrons impinging upon the end of the ingot keep the silicon and create a molten pool whereupon the silicon atoms are ejected from the surface of the molten pool.

Once a flow of silicon atoms is established, a reactive carbon-containing gas can be admitted to the vacuum chamber. The preferred gas is acetylene ($C_2H_2$), which readily decomposes at the substrate temperature to yield free carbon. The pressure of the acetylene gas is not critical and can vary from $10^{-3}$ to about $10^{-6}$ torr. The evaporating silicon atoms react with the carbon produced by the acetylene gas molecules to yield a reaction product which deposits upon the shutter as silicon carbide. Once the silicon carbide deposition parameters are established, the shutter can be opened to allow deposition of the reaction products onto the substrate to produce an overlay layer of β-SiC.

Prior to evaporation and deposition, the uncoated substrate can be heated, by passage of an electrical current through the substrate, via a pair of leads contacting the substrate. The preheat temperature can be controlled by varying the current through the substrate. Deposition may be accomplished over a range of substrate temperatures from about 1000° C. to about 1600° C.

In a typical reactive evaporation deposition procedure, the electron beam current is not critical, but ranges from about 0.07 to about 0.15 amps. No processing or other limitations are known that would restrict the thickness of the overlayer to any particular value. But, a preferred thickness is from about 0.1 to about 100 micrometers. The growth rate is less than 10 micrometer per hour at atmospheric pressure.

The resulting β-SiC carbide overlayer 18 will achieve an epitaxial relationship to the substrate at substrate deposition temperatures greater than about 1250° C. Silicon carbide surface smoothness of acceptable integrated surface quality will be obtained at substrate growth temperatures greater than about 1250° C. The most preferred substrate temperature, using this growth approach, is about 1450° C. Higher temperatures increase the likelihood of silicon carbide polytype formation. At temperatures below about 1200° C., grains will develop in the overlayer. At all temperatures in the range of 1250° C. to 1450° C., the overlay layer will be unpolytyped, pure β-SiC. Hexagonal polytypes will not be present in the overlay layer. Using this technique, it is possible to grow β-SiC that will have a usable diameter of 1.0 cm or more, will be substantially free of defects such as twins, and will not be cracked or otherwise physically damaged. The upper surface of the β-SiC will be smooth and of integrated circuit quality and morphology.

Surface morphology is critical to a successful, repeatable fabrication of devices in a crystal. β-SiC carbide crystals prepared by the present invention will exhibit excellent surface quality.

β-SiC films, made according to the present invention, have been measured and further processed in several different ways to determine their basic electrical characteristics. Prototype devices that have been fabricated and tested include Schottky diodes, p-n diodes, MOS capacitors and MOSFETs.

Chemical vapor deposition (CVD) can also be used to fabricate β-SiC according to the present invention. The 6Hα-SiC/TiC couple substrate of FIG. 1 can be attached to a graphite susceptor and placed into a chamber with an RF heater coil, whereby the substrate is heated to the deposition temperature as a susceptor is heated. The chamber can be vertical double-wall construction so that cooling water can pass through the outer jacket. A reactive gas having a source of carbon and a source of silicon can be introduced at the lower end of the chamber and contacted to the substrate, so that a silicon carbide overlay layer 18 is epitaxially deposited on the titanium carbide surface 16 as a result of a chemical reaction of the surface. The preferred reactive gas is disilylethane ($C_2H_{10}Si_2$) as a single molecular source of silicon and carbon, and hydrogen as a carrier gas. Typical reaction conditions are: $H_2$ flow rate of 1.0 cubic centimeters per minute through the bubbler containing liquid $C_2H_{10}Si_2$ (maintained at 0° C.), and 2900 cubic centimeters per minute of carrier hydrogen. The acceptable substrate temperature range, using $C_2H_{10}Si_2$, is 1290°±10° C. The resulting epitaxial layer 18 will be unpolytyped monocrystalline β-SiC, without cracks (including microcracks), free of twins and of integrated circuit quality surface morphology. Many other reactive gases and combinations of reactive gases are known as sources of silicon and carbon, and the present invention is known to be operable with such combinations.

It will be appreciated by those skilled in the art that the substrate and process of the present invention offer significant advantages in the preparation of monocrystalline β-SiC. By use of this particular substrate, it is possible to fabricate epitaxially an overlay layer of β-SiC having laterally extensive monocrystalline areas suitable for fabrication into semiconductor devices. The β-SiC overlay layer is substantially free of defects such as twins, and is unstrained or is maintained in compression so as to avoid formation of microcracks or other physical defects. The result is a device wafer base that is chemically and physically stable, and may be processed in a manner similar to that of silicon epitaxial structures.

Although a particular embodiment of the invention has been described in detail for purposes of illustration, various modifications may be made without departing from the spirit and scope of the invention. For example, as mentioned above, these techniques could be useful to grow ingots as much as several feet long of cubic materials, such as TiC, ZrC, HfC, and TiN, that have rock salt structures. Ingots of TiC, ZrC, HfC, or TiN would be grown to a thickness greater than 0.5 cm, removed from the 6Hα-SiC, and then cut into one or more self-standing monocrystalline TiC, ZrC, HfC, or TiN substrates free of subgrains and DPBs. β-SiC could then be nucleated and grown on the self-standing TiC, ZrC, HfC, or TiN substrates. Also, as mention above, one can start with a monocrystalline hexagonal material other than 6Hα-SiC, provided that the hexagonal material has a planar surface with a lattice parameter that is within ±5% of the lattice parameter of 6Hα-SiC in the basal plane. Accordingly, the invention is not to be limited except by the appended claims.

We claim:

1. A substrate suitable for the nucleation and growth of subgrain-free and DPB-free monocrystalline β-SiC for semiconductor applications, the substrate comprising:

a body of monocrystalline hexagonal material having a planar surface with a lattice parameter that is within ±5% of the lattice parameter of 6Hα-SiC in the basal plane; and a body of monocrystalline cubic material epitaxially grown on the surface, the cubic material having a rock salt structure and a lattice parameter within ±5% of the lattice parameter of β-SiC, the cubic material being without grain boundaries, subgrain boundaries, and double positioning boundaries.

2. The substrate of claim 1 wherein the surface of the body of monocrystalline hexagonal material consists substantially of 6Hα-SiC.

3. The substrate of claim 1 wherein the cubic rock salt structure material is selected from the group consisting of TiC, ZrC, HfC, and TiN.

4. The substrate of claim 3 wherein the cubic material is TiC.

5. The substrate of claim 1 wherein the body of cubic rock salt structure material is a layer sufficiently thin that any resulting strain in the subsequently grown β-SiC epitaxial layer will be insufficient to generate microtwins in the β-SiC.

6. Monocrystalline β-SiC suitable for semiconductor applications, the β-SiC being made according the process comprising:

providing a body of monocrystalline hexagonal material having a planar surface with a lattice parameter that is within ±5% of the lattice parameter of 6Hα-SiC in the basal plane;

growing a monocrystalline layer of a cubic material on the surface of the body to provide a planar cubic material surface, the cubic material having a rock salt structure and a lattice parameter within ±5% of the lattice parameter of β-SiC; and nucleating and growing monocrystalline β-SiC on the cubic material surface.

7. The monocrystalline β-SiC of claim 6 wherein the surface of the body of monocrystalline hexagonal material consists substantially of 6Hα-SiC.

8. The monocrystalline β-SiC of claim 6 wherein the cubic material is selected from the group consisting of TiC, ZrC, HfC, and TiN.

9. The monocrystalline β-SiC of claim 8 wherein the cubic material is TiC.

10. The monocrystalline β-SiC of claim 6 wherein the growing of the cubic material comprises providing an epilayer having a thickness of at least 50 Å.

11. The monocrystalline β-SiC of claim 6 wherein the growing of the cubic material is conducted epitaxially to provide a cubic material layer sufficiently thin that any strain in the β-SiC is insufficient to generate microtwins in the β-SiC.

12. A substrate suitable for the nucleation and growth of a body of subgrain-free and DPB-free monocrystalline β-SiC for semiconductor applications, the substrate comprising:

a body of monocrystalline hexagonal material having a planar surface with a lattice parameter that is within ±5% of the lattice parameter of 6Hα-SiC in the basal plane; and a layer of monocrystalline cubic material epitaxially deposited on the surface, the cubic material having a rock salt structure and a lattice parameter within ±5% of the lattice parameter of β-SiC, the layer being (a) without grain boundaries, subgrain boundaries, and double positioning boundaries, (b) at least 50 Å thick, and (c) sufficiently thin that any strain imparted to an epitaxial layer of β-SiC grown on the TiC will be insufficient to generate microtwins in the β-SiC.

13. The substrate of claim 12 wherein the cubic rock salt structure material is selected from the group consisting of TiC, ZrC, HfC, and TiN.

14. A substrate suitable for the nucleation and growth of a body of subgrain-free and DPB-free monocrystalline β-SiC for semiconductor applications, the substrate comprising:

a body of monocrystalline 6Hα-SiC having a planar surface; and a layer of monocrystalline TiC epitaxially deposited on the surface, the layer of TiC being (a) without grain boundaries, subgrain boundaries, and double positioning boundaries, (b) at least 50 Å thick, and (c) sufficiently thin that any strain imparted to an epitaxial layer of β-SiC grown on the TiC will be insufficient to generate microtwins in the β-SiC.

15. A body of monocrystalline β-SiC that has a surface with a diameter of at least 1.0 cm and that is suitable for semiconductor applications, the β-SiC being made according to the process comprising:

providing a body of monocrystalline hexagonal material having a planar surface with a lattice parameter that is within ±5% of the lattice parameter of 6Hα-SiC in the basal plane;

epitaxially depositing a layer of monocrystalline cubic material on the surface of the body to provide a planar cubic material surface, the cubic material having a rock salt structure and a lattice parameter within ±5% of the lattice parameter of β-SiC, the layer having a thickness of at least 50 Å and being sufficiently thin that any strain imparted to an epitaxial layer of β-SiC grown on the TiC is insufficient to generate microtwins in the β-SiC; and nucleating and growing a layer of monocrystalline β-SiC on the cubic material surface.

16. The body of monocrystalline β-SiC of claim 15 wherein the cubic rock salt structure material is selected from the group consisting of TiC, ZrC, HfC, and TiN.

17. A body of monocrystalline β-SiC that has a surface with a diameter of at least 1.0 cm and that is suitable for semiconductor applications, the β-SiC being made according to the process comprising:

providing a body of monocrystalline 6Hα-SiC having a planar surface;

epitaxially depositing a layer of monocrystalline TiC on the surface of the body to provide a planar TiC surface, the layer having a thickness of at least 50 Å and being sufficiently thin that any strain imparted to an epitaxial layer of β-SiC grown on the TiC is insufficient to generate microtwins in the β-SiC; and nucleating and growing a layer of monocrystalline β-SiC on the TiC surface.

* * * * *